US007893909B2

(12) United States Patent
Sung

(10) Patent No.: US 7,893,909 B2
(45) Date of Patent: Feb. 22, 2011

(54) TFT LCD DEVICE AND DRIVING METHOD WITH A CHOPPER AMPLIFIER THAT ALLOWS OFFSET VOLTAGE POLARITY INTERLACE WITHIN ONE FRAME

(75) Inventor: Kuang-Feng Sung, Taichung County (TW)

(73) Assignee: Novatek Microelectronics Corp., Hsinchu (TW)

(*) Notice: Subject to any disclaimer, the term of this patent is extended or adjusted under 35 U.S.C. 154(b) by 667 days.

(21) Appl. No.: 11/463,596

(22) Filed: Aug. 10, 2006

(65) Prior Publication Data

US 2007/0242024 A1 Oct. 18, 2007

(30) Foreign Application Priority Data

Apr. 13, 2006 (TW) ............................ 95113133 A

(51) Int. Cl.
*G09G 3/36* (2006.01)
*G09G 5/00* (2006.01)
*G06F 3/038* (2006.01)
*H03F 3/04* (2006.01)

(52) U.S. Cl. ........................................ 345/96; 330/250

(58) Field of Classification Search ........... 345/87–100, 345/204; 330/250–311; 327/408–413, 124
See application file for complete search history.

(56) References Cited

U.S. PATENT DOCUMENTS 6,008,801 A * 12/1999 Jeong ........................ 345/204
6,331,846 B1 * 12/2001 Nakao ........................ 345/96
6,628,253 B1 * 9/2003 Hiroki ........................ 345/87
6,707,442 B2 * 3/2004 Watanabe .................. 345/100
6,870,524 B2 * 3/2005 Katsutani ..................... 345/98
7,319,450 B2 * 1/2008 Choi .......................... 345/92
2001/0000662 A1 * 5/2001 Hashimoto et al. ............ 345/96
2006/0017680 A1 * 1/2006 Chen et al. .................... 345/96

FOREIGN PATENT DOCUMENTS

JP 11249623 A * 9/1999

* cited by examiner

*Primary Examiner*—Amr Awad
*Assistant Examiner*—Liliana Cerullo
(74) *Attorney, Agent, or Firm*—Jianq Chyun IP Office

(57) ABSTRACT

A thin film transistor (TFT) liquid crystal display panel driving device and a method thereof are provided. The TFT liquid crystal display panel driving device is characterized by including a modulation signal generator for providing at least one modulation signal to at least one output buffer of a source driver of the TFT liquid crystal display panel. The output buffer(s) has chopper function. Each output buffer changes the offset voltages of the pixels of a same frame under the control of different modulation signals, thus eliminating the effect of the offset voltages of the output buffer(s) on the display quality.

13 Claims, 13 Drawing Sheets

TFT LCD DEVICE AND DRIVING METHOD WITH A CHOPPER AMPLIFIER THAT ALLOWS OFFSET VOLTAGE POLARITY INTERLACE WITHIN ONE FRAME

CROSS-REFERENCE TO RELATED APPLICATION

This application claims the priority benefit of Taiwan application serial no. 95113133, filed on Apr. 13, 2006. All disclosure of the Taiwan application is incorporated herein by reference.

BACKGROUND OF THE INVENTION

1. Field of Invention

The present invention relates to a display panel driving device and a method thereof, and more particularly, to a TFT liquid crystal display panel driving device and a method thereof.

2. Description of Related Art

At present, the mainstream TFT liquid crystal display panel adopts an operational amplifier to drive the pixel units on a display at different voltages, so as to display different frames on the display. Therefore, the display quality of the display and the features of the operational amplifier are highly correlative. The main variable of the operational amplifier affecting the frame quality is offset voltage generated due to changes in the process. Conventionally, two conventional methods are mainly used to eliminate the offset voltage: one is auto zeroing, wherein a capacitor is required to store the offset voltage, resulting in the need of extra control signals and increase of the circuit area; and the other is using a chopper to compensate the offset voltage.

FIG. 1A is a block diagram of a driving device of a conventional TFT liquid crystal display panel adopting a chopper. Display data 1~n are input into operational amplifiers 12_1~12_n with chopper function through digital-to-analog converters 11_1~11_n. A control signal controls the operational amplifiers 12_1~12_n to modulate the offset voltages. The operational amplifiers 12_1~12_n output voltages to channels 1~n. FIG. 1B is a voltage-to-time diagram of the polarity (POL) signal and control signal of FIG. 1A, wherein the longitudinal axis of FIG. 1B represents voltage and the horizontal axis represents time. In the most common dot inversion driving architecture at present, the POL signal controls the output polarity of the source driver and is converted at every one frame, wherein frames F11, F12, F13, F14 are displayed at the time periods 0~T11, T11~T12, T12~T13, T13~T14. The control signal is Logic 1 at frames F11 and F12, and Logic 0 at frames F13 and F14. FIG. 1C is a voltage-to-time diagram of an ideal output waveform 102 and an actual output waveform 101 in FIG. 1A, wherein the longitudinal axis of FIG. 1C represents voltage and the horizontal axis represents time. When the frame F11 is displayed, the voltage of the ideal output waveform 102 is VP1, and the voltage of the actual output waveform 101 is V1, thus generating an offset voltage of V1−VP1=ΔV. When the frame F12 is displayed, the voltage of the ideal output waveform 102 is VN1, and the voltage of the actual output waveform 101 is V2, thus generating an offset voltage of V2−VN1=ΔV. When the frame F13 is displayed, the offset voltage is V3−VP1=−ΔV. When the frame F14 is displayed, the offset voltage is V4−VN1=−ΔV. FIG. 1D is an offset voltage distribution diagram of the frames F11~F14. The offset voltages of the pixels in the frames F11 and F12 are all ΔV, while those of frames F13 and F14 are all −ΔV. As the human eye can be considered to be a low-pass filter, after the control signal controls the operational amplifier with chopper function for a short period of time, the human eye can compensate the offset voltage, and thus the offset voltage is 0 to the human eye.

Though the method solves the offset voltage problem of the operational amplifier, taking 60 frames per second as an example, for each pixel on the panel, there are 30 positive polarity voltages and 30 negative polarity voltages on the pixel. To compensate the offset voltages, the 30 positive polarity voltages and 30 negative polarity voltages are respectively further divided into 15 positive offset voltages and 15 negative offset voltages. The frequency of a chopper is a quarter that of a frame, and under such a low time frequency, the human eye can easily sense the changes in brightness in the whole area, thus causing the frame flickering phenomenon. Therefore, as the aforementioned conventional art uses time modulation to control the chopper, the frame quality is greatly degraded.

SUMMARY OF THE INVENTION

An objective of the present invention is to provide a liquid crystal display panel source driving device for providing different modulation signals to output buffers controlling two portions of pixels in the same frame, so as to eliminate the adverse effect of the offset voltages, prevent the frame flickering phenomenon, reduce the area of the integrated circuit and improve the display quality.

Another objective of the present invention is to provide a TFT liquid crystal display panel driving method for providing different modulation signals to output buffers controlling two portions of pixels in a frame, so as to eliminate the adverse effect of the offset voltages, reduce the area of the integrated circuit, prevent the frame flickering phenomenon and improve the display quality.

Another objective of the present invention is to provide a TFT liquid crystal display panel driving device for providing different modulation signals to output buffers at the odd and even output ends of the source driver, so as to eliminate the adverse effect of the offset voltages, save circuit elements, prevent the frame flickering phenomenon and improve the display quality.

Another objective of the present invention is to provide a TFT liquid crystal display panel driving method for providing different modulation signals to output buffers at the odd and even output ends of the source driver, wherein the modulation signals are changed according to the odd and even scan lines of the output buffers in the frame, so as to eliminate the adverse effect of the offset voltages, save the circuit elements, prevent the frame flickering phenomenon and improve the display quality.

Another objective of the present invention is to provide a TFT liquid crystal display panel driving device, wherein the modulation signals are changed according to the odd and even scan lines in the frame, so as to eliminate the adverse effect of the offset voltages caused by process differences, reduce the area of the integrated circuit, prevent the frame flickering phenomenon and improve the display quality.

Another objective of the present invention is to provide a TFT liquid crystal display panel driving method, wherein the modulation signals are changed according to the odd and even scan lines in the frame, so as to eliminate the adverse effect of the offset voltages caused by process differences, prevent the frame flickering phenomenon, reduce the area of the integrated circuit and improve the display quality.

Another objective of the present invention is to provide a TFT liquid crystal display panel driving device for providing different modulation signals to output buffers at the odd and even output ends of the source driver, wherein the modulation signals are changed according to the odd and even scan lines in the frame, so as to improve the display quality, eliminate the adverse effect of the offset voltages caused by process differences, reduce the circuit area and prevent the frame flickering phenomenon.

Another objective of the present invention is to provide a TFT liquid crystal display panel driving method for providing different modulation signals to output buffers at the odd and even output ends of the source driver, wherein the modulation signals are changed according to the odd and even scan lines in the frame, so as to improve the display quality, eliminate the adverse effect of the offset voltages caused by process differences and prevent the frame flickering phenomenon.

To achieve the above or other objectives, the present invention provides a liquid crystal display panel source driving device comprising at least one output buffer and a modulation signal generator, wherein the output buffer(s) has chopper function and the modulation signal generator provides at least one modulation signal to the output buffer(s). When the pixel data of a first portion of a frame is output, the modulation signals received by the output buffers for outputting the pixel data of the first portion are all in a first state. When the pixel data of a second portion of the frame is output, the modulation signals received by the output buffers for outputting the pixel data of the second portion are all in a second state. Moreover, the numbers of the pixels in the first portion and the second portion are approximately the same.

From another point of view, the present invention further provides a TFT liquid crystal display panel driving method. When the pixel data of the first portion of a frame is output, at least one modulation signal in the first state is provided to at least one output buffer for outputting the pixel data of the first portion in the source driver of the TFT liquid crystal display panel, wherein the output buffer has chopper function. When the pixel data of the second portion of the frame is output, the modulation signal in the second state is provided to the output buffer for outputting the pixel data of the second portion. Moreover, the numbers of the pixels in the first portion and the second portion are approximately the same.

From another point of view, the present invention further provides a TFT liquid crystal display panel driving device. The device is characterized by comprising a modulation signal generator for providing the first modulation signal to at least one output buffer at the odd output ends in the source driver of the TFT liquid crystal display panel, and providing the second modulation signal to at least one output buffer at the even output ends in the source driver, wherein the output buffers all have chopper function. When the first and the second frames are output, the first modulation signal is in the first state and the second modulation signal is in the second state. When the third and the fourth frames are output, the first modulation signal is in the second state and the second modulation signal is in the first state.

From another point of view, the present invention further provides a TFT liquid crystal display panel driving method, which comprises providing the first modulation signal to at least one output buffer at the odd output ends in the source driver of the TFT liquid crystal display panel, and providing the second modulation signal to at least one output buffer at the even output ends in the source driver, wherein the output buffers all have chopper function. When the first and the second frames are output, the first modulation signal is in the first state and the second modulation signal is in the second state. When the third and the fourth frames are output, the first modulation signal is in the second state and the second modulation signal is in the first state.

From another point of view, the present invention further provides a TFT liquid crystal display panel driving device. The device is characterized by comprising a modulation signal generator for providing modulation signals to at least one output buffer in the source driver of the TFT liquid crystal display panel, wherein the output buffers all have chopper function. When the odd scan lines of the first and the second frames and the even scan lines of the third and the fourth frames are output, the modulation signals are in the first state. When the even scan lines of the first and the second frames and the odd scan lines of the third and the fourth frames are output, the modulation signals are in the second state.

From another point of view, the present invention further provides a TFT liquid crystal display panel driving method. The method is characterized by providing a modulation signal to at least one output buffer in the source driver of the TFT liquid crystal display panel, wherein the output buffers all have chopper function. When the odd scan lines of the first and the second frames and the even scan lines of the third and the fourth frames are output, the modulation signal is in the first state. When the even scan lines of the first and the second frames and the odd scan lines of the third and the fourth frames are output, the modulation signal is in the second state.

From another point of view, the present invention further provides a TFT liquid crystal display panel driving device. The device is characterized by comprising a modulation signal generator for providing the first modulation signal to at least one output buffer at the odd output end in the source driver of the TFT liquid crystal display panel and providing the second modulation signal to at least one output buffer at the even output end in the source driver, wherein the output buffers all have chopper function. When the odd scan lines of the first and the second frames and the even scan lines of the third and the fourth frames are output, the first modulation signal is in the first state and the second modulation signal is in the second state. When the even scan lines of the first and the second frames and the odd scan lines of the third and the fourth frames are output, the first modulation signal is in the second state and the second modulation signal is in the first state.

From another point of view, the present invention further provides a TFT liquid crystal display panel driving method. The method comprises providing the first modulation signal to at least one output buffer at the odd output end in the source driver of the TFT liquid crystal display panel, and providing the second modulation signal to at least one output buffer at the even output end in the source driver, wherein the output buffers all have chopper function. When the odd scan lines of the first and the second frames and the even scan lines of the third and the fourth frames are output, the first modulation signal is in the first state and the second modulation signal is in the second state. When the even scan lines of the first and the second frames and the odd scan lines of the third and the fourth frames are output, the first modulation signal is in the second state and the second modulation signal is in the first state.

In the present invention, different modulation signals are applied to output buffers corresponding to individual pixels of a frame and a high-frequency space modulation is used to substitute the low-frequency time modulation, so as to eliminate the adverse effect of the offset voltages caused by process differences after the automatic compensation of the human eye, and also prevent the frame flickering phenomenon in the conventional art and improve the display quality due to the significant increase in the modulation frequency.

Moreover, the present invention does not require a capacitor to store the offset voltages, thus reducing the area of the integrated circuit.

In order to make the aforementioned and other objects, features and advantages of the present invention comprehensible, preferred embodiments accompanied with figures are described in detail below.

DESCRIPTION OF EMBODIMENTS

Figure 1A:
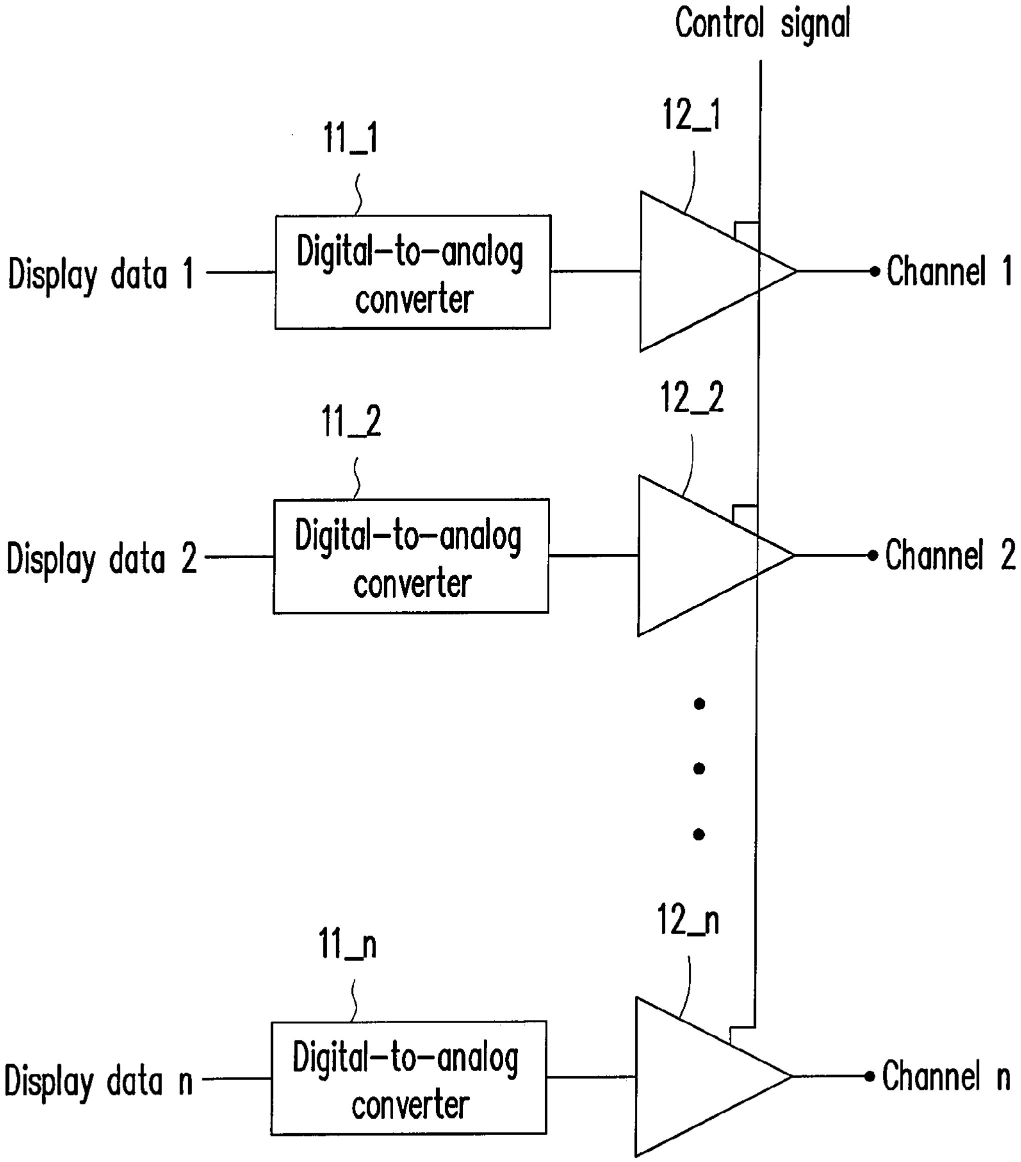
FIG. 1A (PRIOR ART)
FIG. 1A is a block diagram of the driving device of the conventional TFT liquid crystal display panel with a chopper.
Figure 1B:
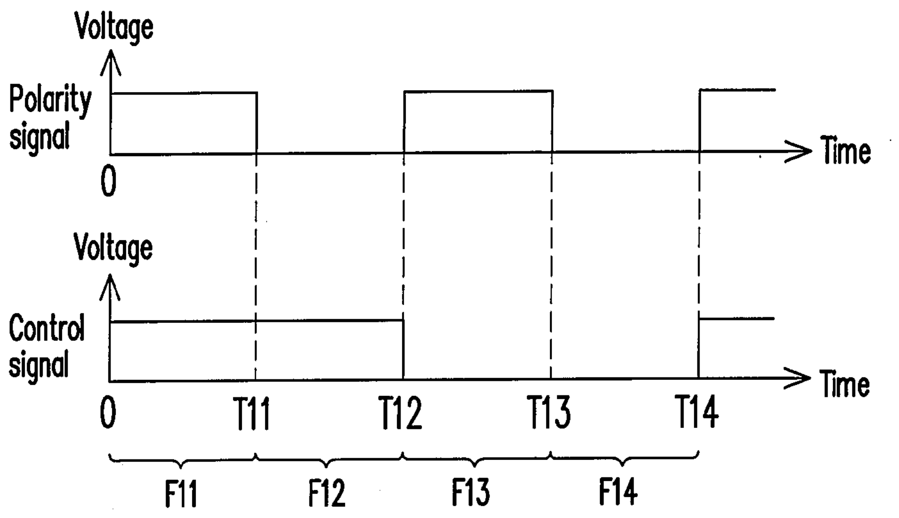
FIG. 1B (PRIOR ART)
FIG. 1B is a voltage-to-time diagram of the POL signal and the control signal in FIG. 1A.
Figure 1C:
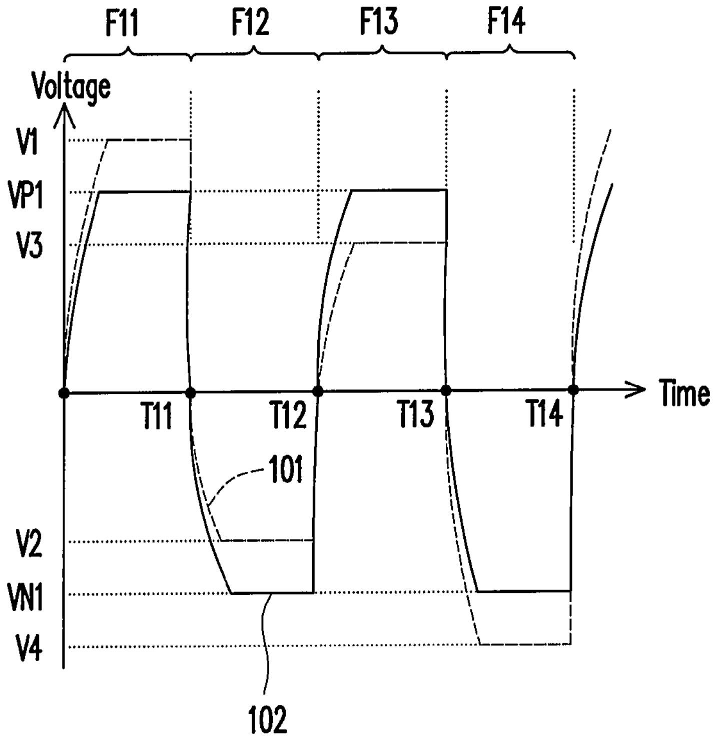
FIG. 1C (PRIOR ART)
FIG. 1C is a voltage-to-time diagram of the ideal output waveform 102 and the actual output waveform 101 in FIG. 1A.
Figure 1D:
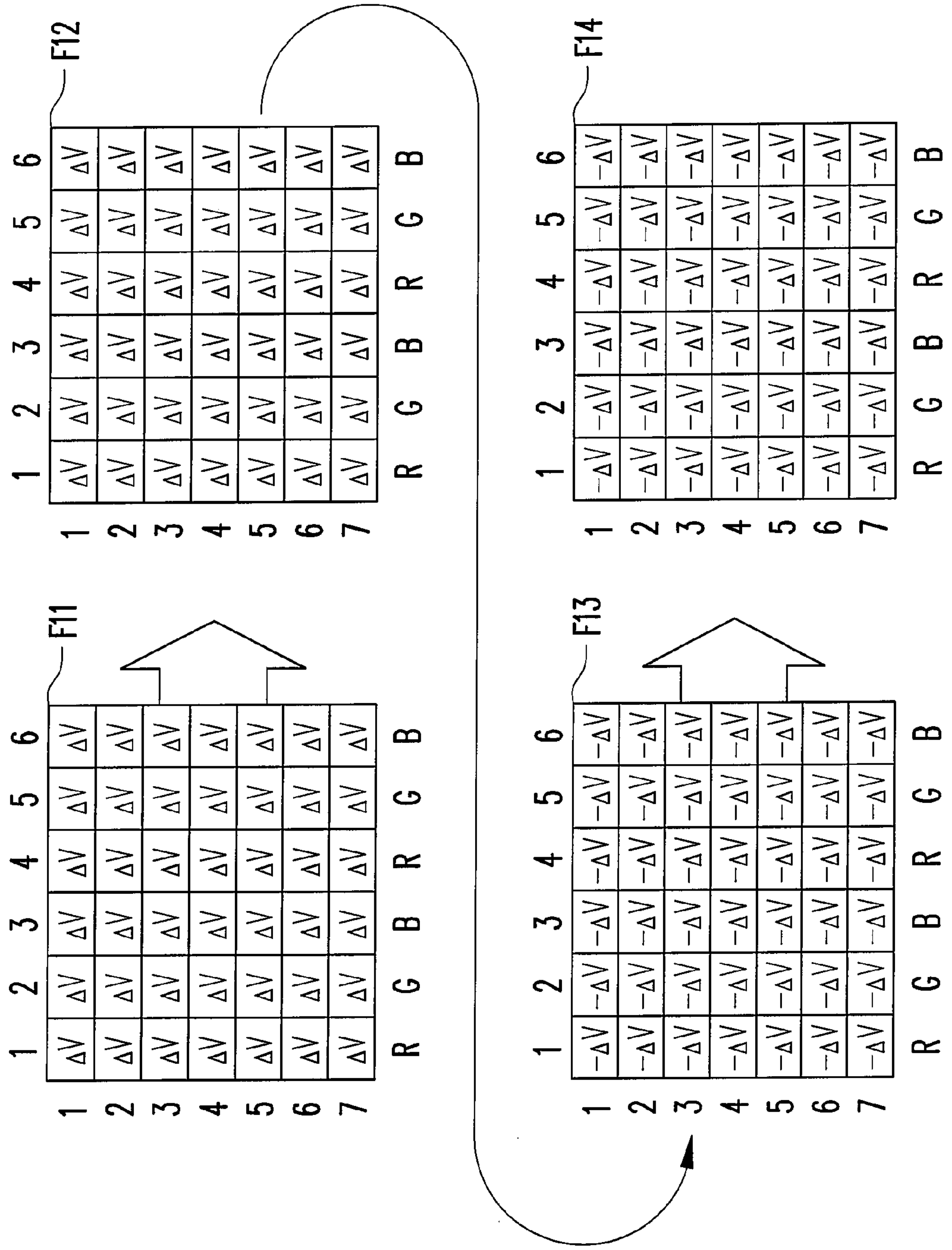
FIG. 1D (PRIOR ART)
FIG. 1D is an offset voltage distribution diagram of the frames F11~F14.
Figure 2A:
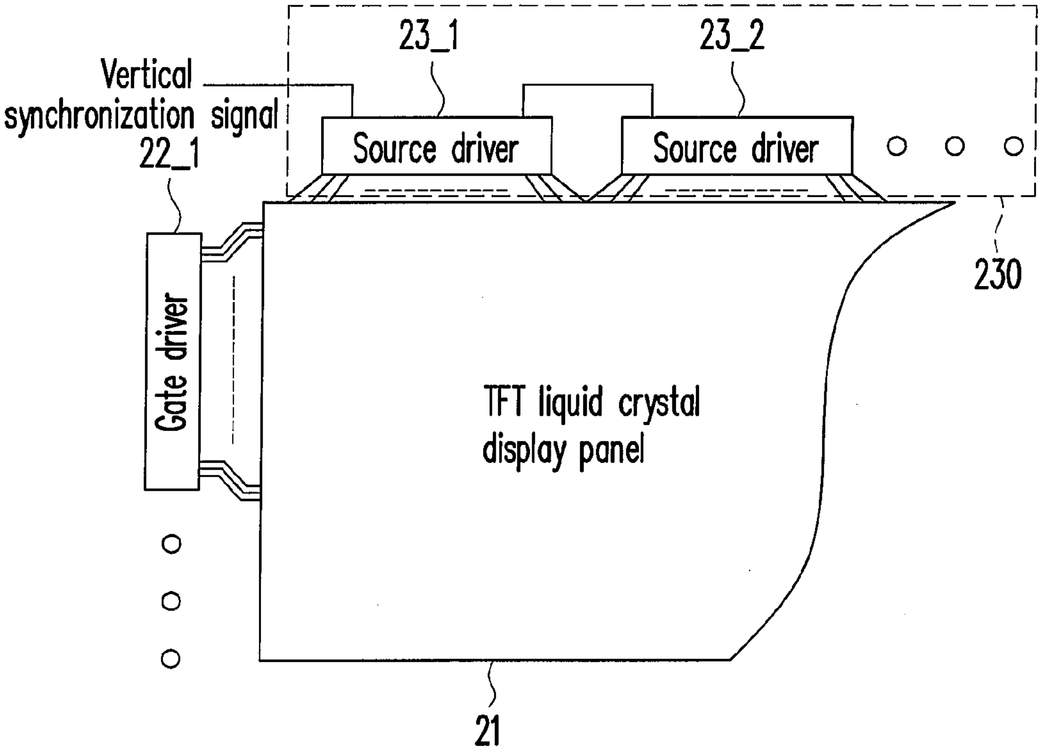
FIG. 2A is a block diagram of the driving device of the TFT LCD according to an embodiment of the present invention.
Figure 2B:
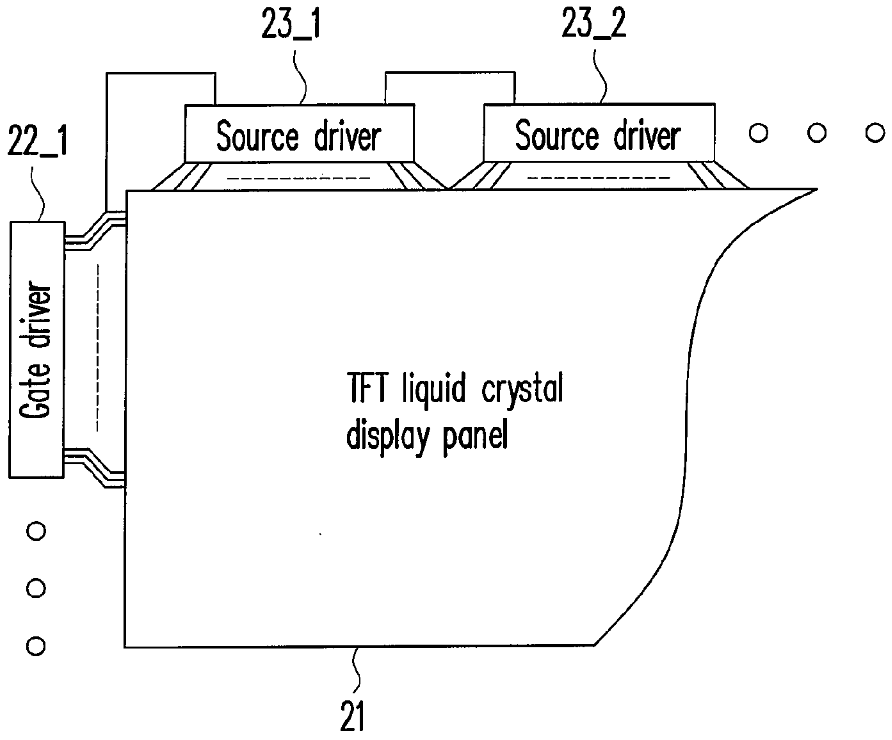
FIG. 2B is a block diagram of the driving device of the TFT LCD according to another embodiment of the present invention.

FIG. 2A is a block diagram of the driving device of a TFT LCD according to an embodiment of the present invention. A vertical synchronization signal functioning as an activating signal for eliminating the offset voltages is input into source drivers 23_1, 23_2 . . . of a TFT liquid crystal display panel driving device 230. The source drivers 23_1, 23_2 . . . drive the liquid crystal display panel together with gate drivers 22_1 . . . . FIG. 2B is a block diagram of the driving device of the TFT LCD according to another embodiment of the present invention. FIG. 2B and FIG. 2A are different in that the first output signal of the gate driver 22_1 is used as an activating signal.

Figure 2C:
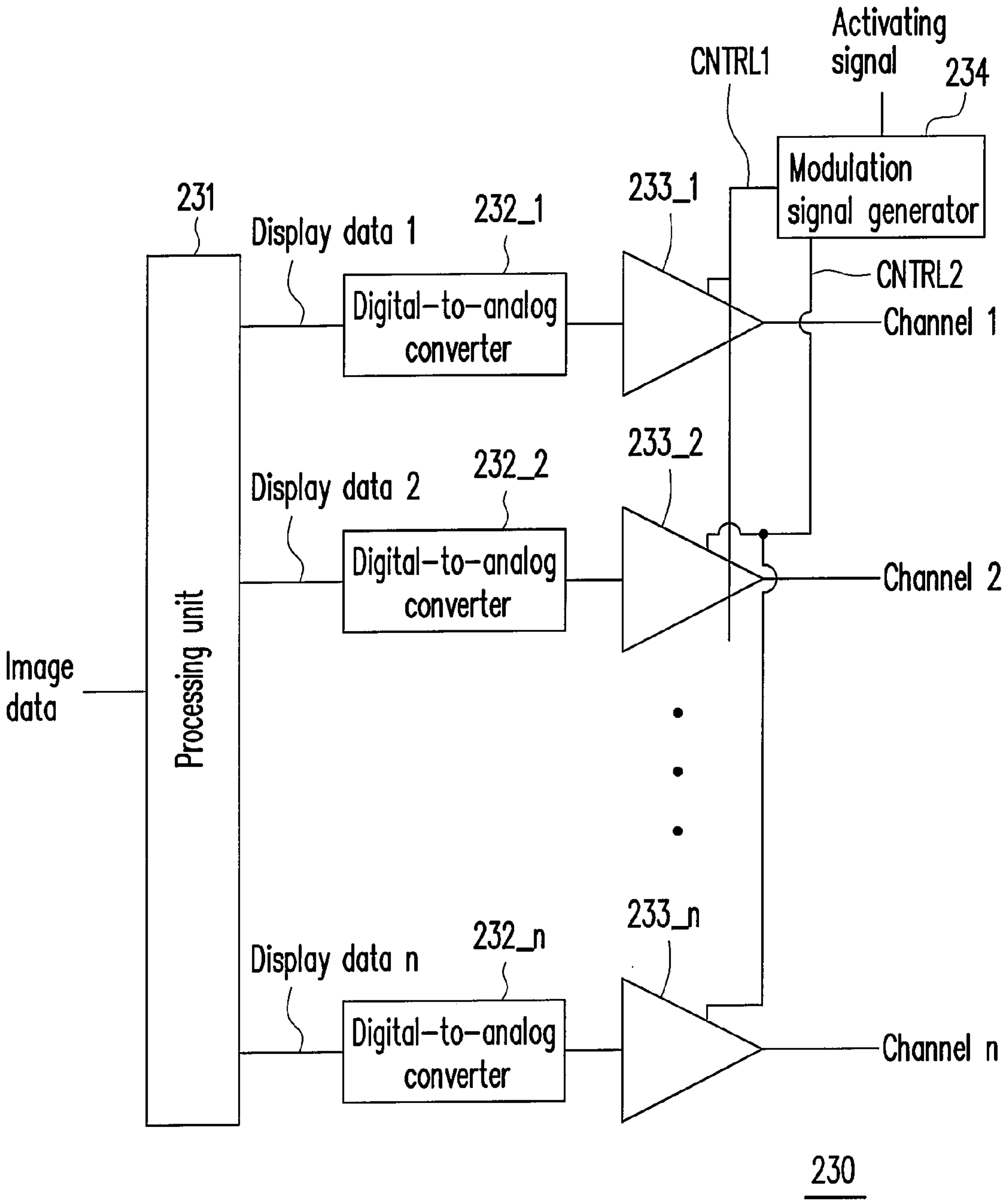
FIG. 2C is a circuit block diagram of the source driver 23_1.

Each source driver of the present embodiment has the same structure, the source driver 23_1 is taken as an example, and FIG. 2C is a circuit block diagram of the source driver 23_1. Image data is input into a processing unit 231 for pretreatment, and the display data 1~n are output to digital-to-analog converters 232_1~232_n and then output to the channels 1~n through the output buffers 233_1~233_n. A modulation signal generator 234 generates modulation signals CNTRL1 and CNTRL2, and changes the logic states of the modulation signals CNTRL1, CNTRL2 according to the activating signal. Here, the activating signal can be a vertical synchronization signal or the first output signal of the gate driver 22_1, for representing the starting time point of each frame. The modulation signal CNTRL1 is input into odd output buffers 233_1, 233_3 . . . , and the modulation signal CNTRL2 is input into even output buffers 233_2, 233_4 . . . . The output buffers 233_1~233_n all have chopper function, and the modulation signals CNTRL1, CNTRL2 are used to eliminate the adverse effect of the offset voltages of the output buffer 233 on the frame quality. In the embodiment, the source driver is a source driving device, which utilizes the modulation signal generator 234 to control the output buffers 233_1~233_n, so as to eliminate the offset voltages and thereby drive the device of the liquid crystal display panel.

Figure 2D:
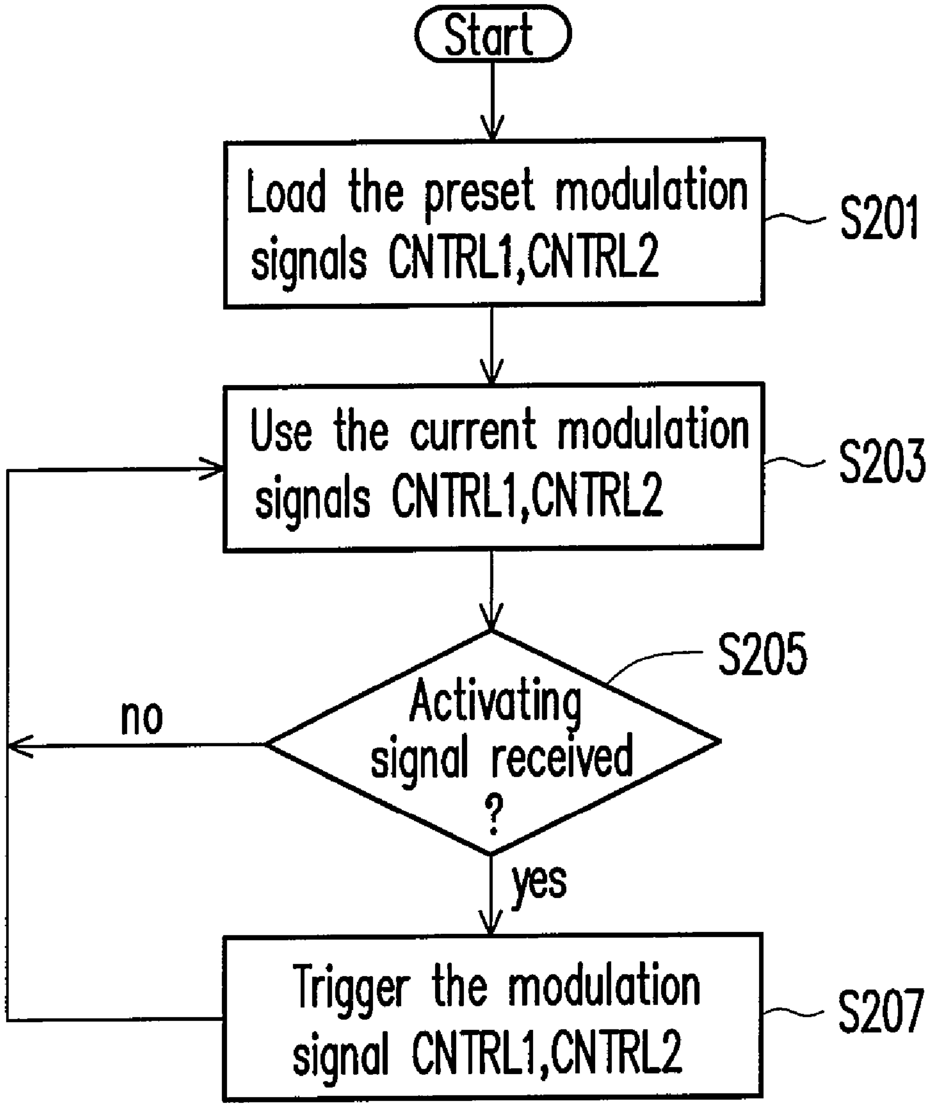
FIG. 2D is a flow chart diagram of the operation of the modulation signals CNTRL1 and CNTRL2.

FIG. 2D is a flow chart diagram of the operation of modulation signals CNTRL1 and CNTRL2. Initially, the preset modulation signals CNTRL1, CNTRL2 are loaded in Step S201. Then, in Step S203, the modulation signals CNTRL1, CNTRL2 are used and in Step S205, whether an activating signal is received is determined. Here, the activating signal can be a POL signal, a vertical synchronization signal or the first output signal of the gate driver 22_1, or another signal synchronous with the starting time of each frame. If the activating signal is not received, the operation goes back to Step S203 of using the current modulation signals CNTRL1 and CNTRL2. If the activating signal is received, the logic states of the modulation signals CNTRL1 and CNTRL2 are changed in Step S207.

Figure 2E:
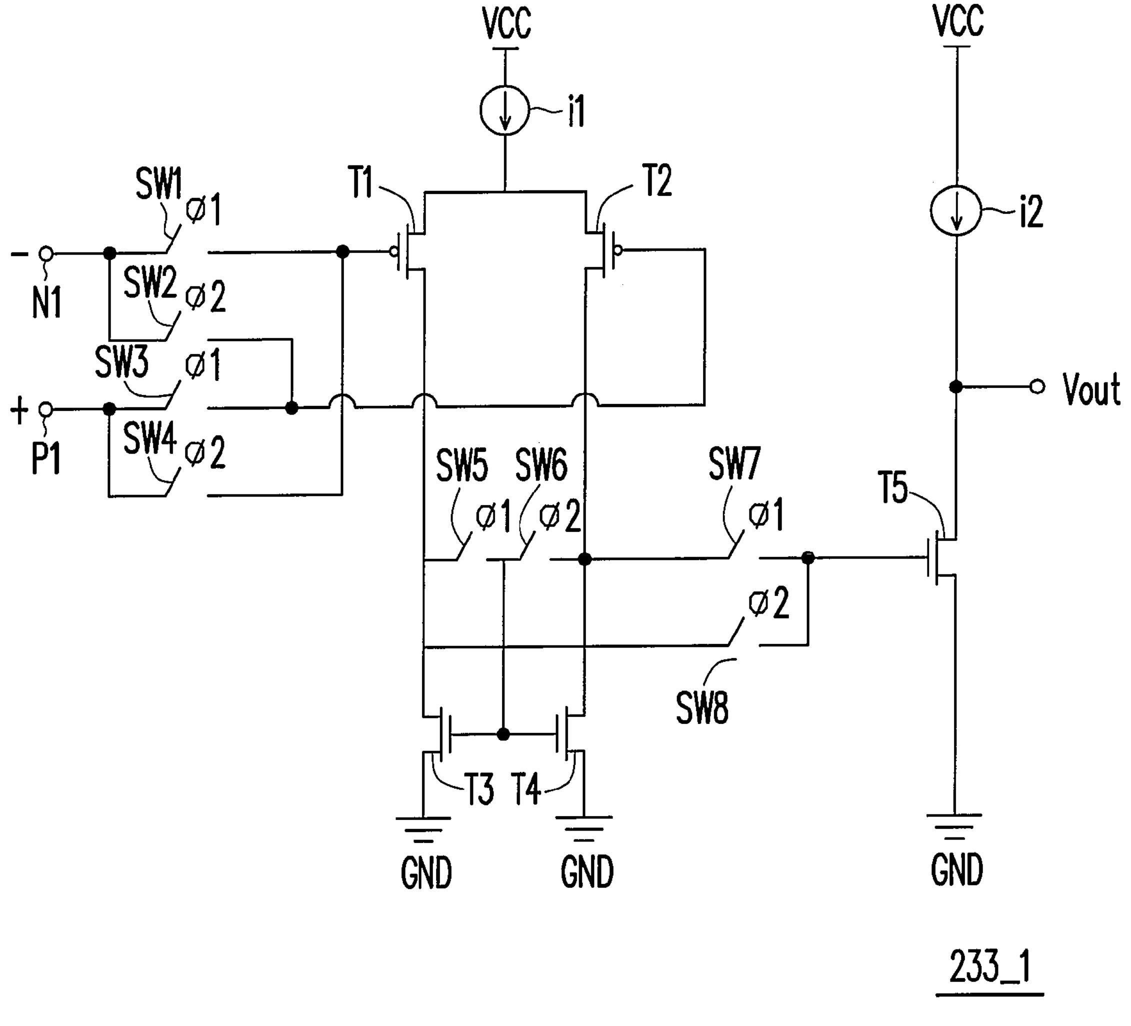
FIG. 2E is a circuit diagram of the output buffer 233_1.

The output buffers in the present embodiment have various structures, the output buffer 233_1 is taken as an example, and FIG. 2E is a circuit diagram of the output buffer 233_1. The output buffer 233_1 receives the modulation signal CNTRL1 to output two different offset voltages. For ease of representation, a signal $\phi$2 is used to represent the modulation signal CNTRL1 and a signal $\phi$1 is used to represent the inverted modulation signal /CNTRL1 in FIG. 2E. The signal $\phi$2 controls switches SW2, SW4, SW6, SW8, and the signal $\phi$1 controls switches SW1, SW3, SW5, SW7. A positive input end P1 and a negative input end N1 of the output buffer 233_1 are respectively connected to a control end of a P-type MOS transistor T1 and a control end of a P-type transistor T2 through switches SW1, SW2 and switches SW3, SW4, so as to input the voltages at the input ends P1, N1 in time sequence into a differential transistor pair formed by transistors T1 and T2. One end of a current source i1 is coupled to a voltage VCC and the other end is coupled to the transistors T1, T2, for providing a driving current to the transistors T1 and T2. Besides, the other ends of the transistors T1 and T2 are respectively coupled to an N-type MOS transistor T3 and an N-type MOS transistor T4, for outputting the driving current to a control end of an N-type MOS transistor T5 under the control of switches SW5, SW6, SW7 and SW8. A current source i2 provides a driving current to the transistor T5 and the transistor T5 outputs output voltages of two offset voltages from an output end Vout in time sequence.

Figure 2F:
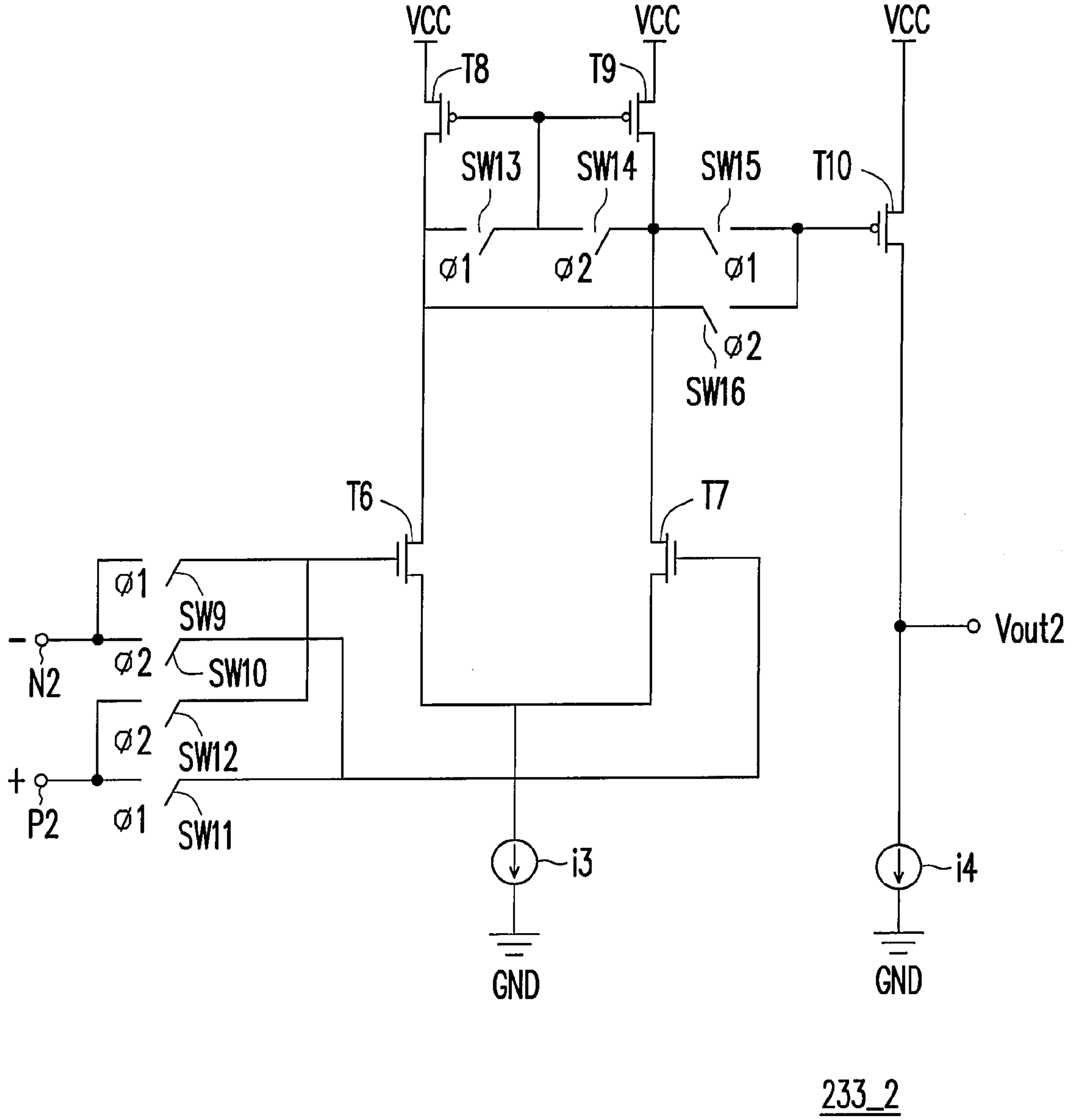
FIG. 2F is a circuit diagram of another embodiment of the output buffer.

FIG. 2F is a circuit diagram of another embodiment of the output buffer 233_2. In FIG. 2F, the output buffer 233_2 receives the modulation signal CNTRL1 to output two different offset voltages. The difference between FIG. 2F and FIG. 2E is that, in FIG. 2E, the transistors T1, T2 of the differential transistor pair coupled to the input ends P1, N1 are both P-type MOS transistors and the other transistors T3, T4, T5 are N-type MOS transistors; while in FIG. 2F, the transistors T6, T7 of the differential transistor pair coupled to the input ends P2, N2 are both N-type MOS transistors and the other transistors T8, T9, T10 are P-type MOS transistors. The positive input end P2 and the negative input end N2 of the output buffer 233_2 are respectively connected to a control end of the transistor T6 and a control end of the transistor T7 through switches SW9, SW10 and switches SW11, SW12. One end of a current source i3 is coupled to a voltage GND while the other end is coupled to the transistors T6 and T7, for providing a driving current to the transistors T6 and T7. Besides, the other ends of the transistors T6 and T7 are respectively coupled to transistors T8 and T9, for outputting the driving current to a control end of the transistor T10 under the control of switches SW13, SW14, SW15 and SW16. A current source i4 provides a driving current to the transistor T10 and the transistor T10 outputs output voltages of two offset voltages from an output end Vout2 in time sequence. FIGS. 2E and 2F are only two examples of the output buffer, and the output buffers can be optionally designed as output buffers in other forms with chopper function.

Figure 3A:
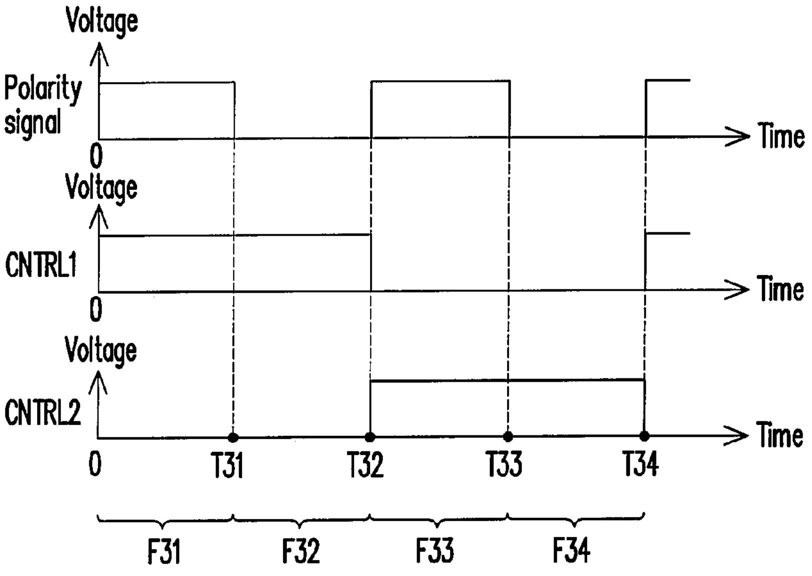
FIG. 3A is a voltage-to-time diagram of the POL signal, modulation signal CNTRL1, modulation signal CNTRL2 according to an embodiment of the present invention.

FIG. 3A is a timing diagram of the POL signal, modulation signal CNTRL1, and modulation signal CNTRL2 according to an embodiment of the present invention. Frames F31, F32, F33, F34 are respectively displayed during time periods 0~T31, T31~T32, T32~T33, T33~T34. The POL signal is Logic 1 when frames F31 and F33 are displayed, and becomes Logic 0 when frames F32 and F34 are displayed. When the frames F31 and F32 are displayed, the modulation signal CNTRL1 is Logic 1 and the modulation signal CNTRL2 is Logic 0 according to the state of the POL signal. When the frames F33 and F34 are displayed, the modulation signal CNTRL1 is changed to Logic 0 and the modulation signal CNTRL2 is changed to Logic 1 according to the state of the POL signal. Other frames can be deduced likewise according to the same cycle of every four frames.

In the present embodiment, when the modulation signal CNTRL1 is Logic 1, the output voltages of the output buffers 233_1, 233_3 . . . corresponding to the modulation signal CNTRL1 are larger than their input voltages, that is, they are positive offset voltages. When the modulation signal CNTRL1 is Logic 0, the output voltages of the output buffers 233_1, 233_3 . . . corresponding to the modulation signal CNTRL1 are smaller than their input voltages, that is, they are negative offset voltages. Likewise, when the modulation signal CNTRL2 is Logic 1, the output voltages of the output buffers 233_2, 233_4 . . . are larger than their input voltages, that is, they are positive offset voltages. When the modulation signal CNTRL1 is Logic 0, the output voltages of the output buffers 233_2, 233_4 . . . are smaller than their input voltages, that is, they are negative offset voltages.

Figure 3B:
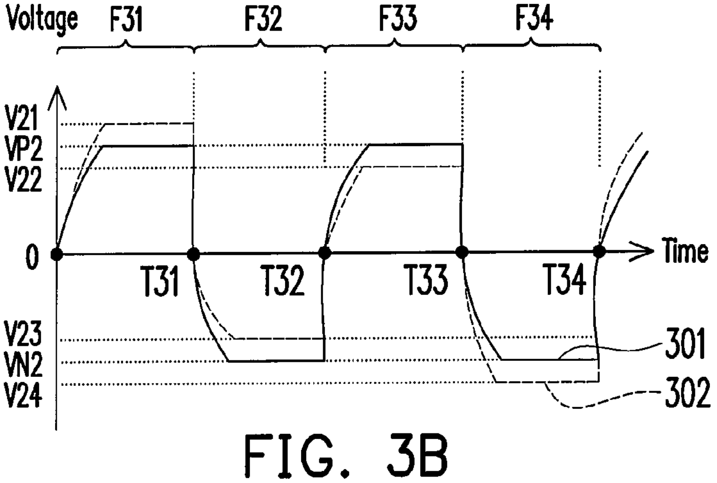
FIG. 3B is a voltage-to-time diagram of the ideal output waveform 301 and the actual output waveform 302 of the output buffer 233_1.

FIG. 3B is a voltage-to-time diagram of an ideal output waveform 301 and an actual output waveform 302 of the output buffer 233_1. When the frame F31 is displayed, the voltage of the ideal output waveform 301 is VP2, the voltage of the actual output waveform 302 is V21, and thus the offset voltage is V21−VP2=ΔV. When the frame F32 is displayed, the voltage of the ideal output waveform 301 is VN2, the voltage of the actual output waveform 302 is V23, and thus the offset voltage is V23−VN2=ΔV. When the frame F33 is displayed, the offset voltages is V22−VP2=−ΔV. When the frame F34 is displayed, the offset voltage is V24−VN2=−ΔV.

Figure 3C:
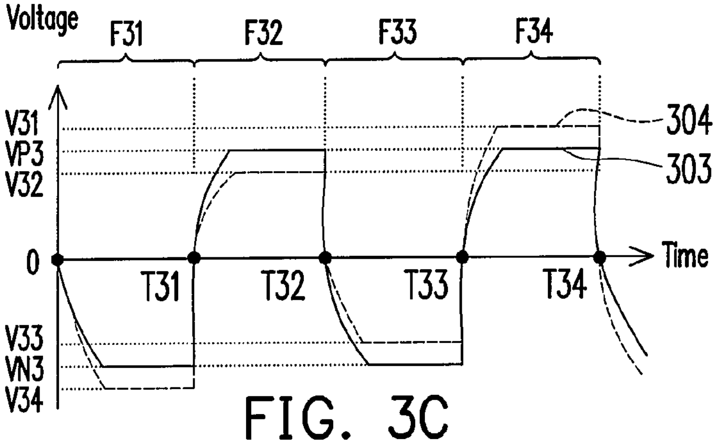
FIG. 3C is a voltage-to-time diagram of the ideal output waveform 303 and the actual output waveform 304 of the output buffer 233_2.

FIG. 3C is a voltage-to-time diagram of an ideal output waveform 303 and an actual output waveform 304 of the output buffer 233_2. When the frame F31 is displayed, the offset voltage is V34−VN3=−ΔV. When the frame F32 is displayed, the offset voltage is V32−VP3=−ΔV. When the frame F33 is displayed, the offset voltage is V33−VN3=ΔV. When the frame F34 is displayed, the offset voltage is V31−VP3=ΔV.

Figure 3D:
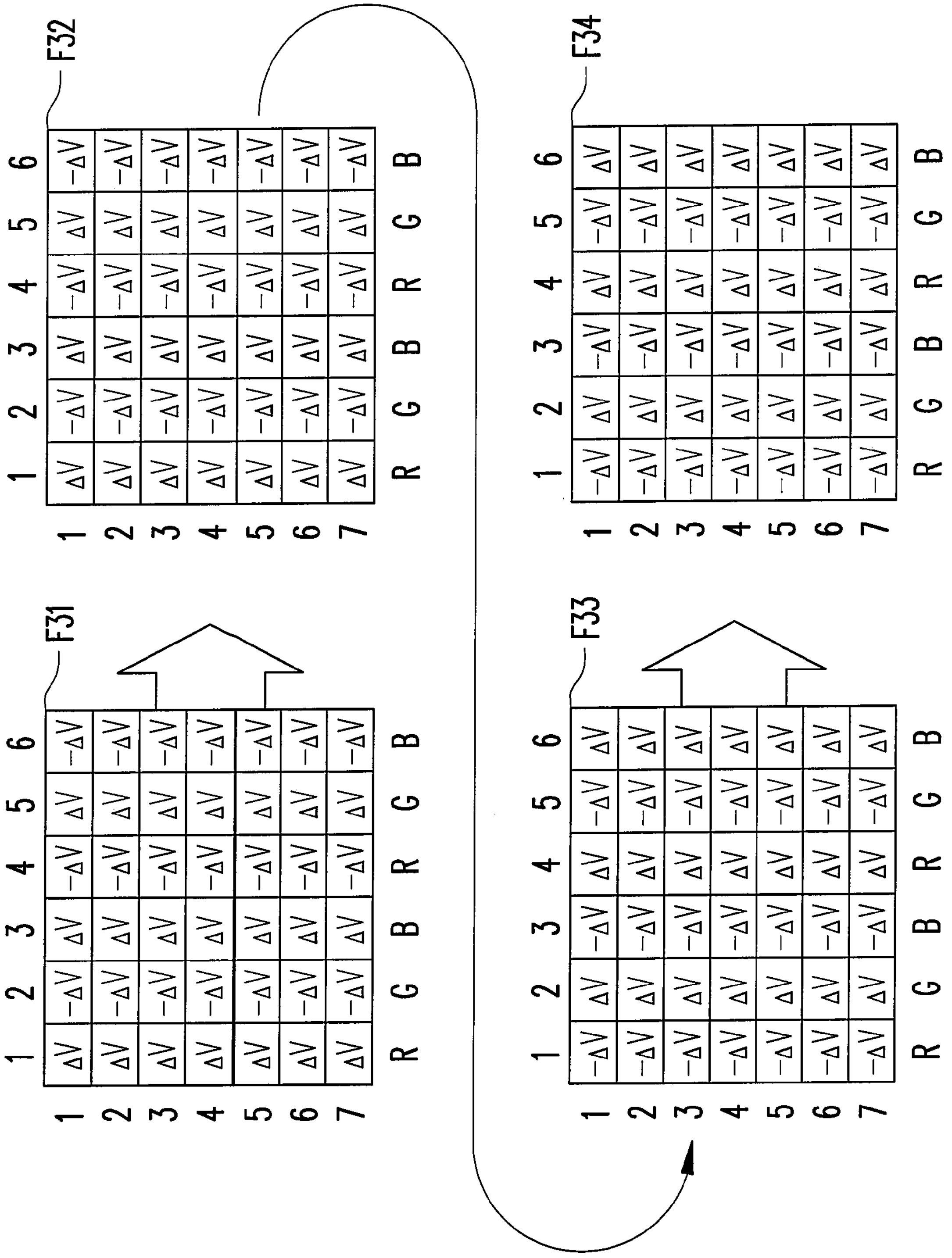
FIG. 3D is an offset voltage distribution diagram of the frames F31~F34 according to an embodiment of the present invention.

FIG. 3D is an offset voltage distribution diagram of the frames F31~F34 according to an embodiment to the present invention. In FIG. 3D, the positive/negative offset voltages are distributed in a column interlaced manner. The present embodiment adopts the modulation signals CNTRL1 and CNTRL2 generated by the modulation signal generator 234 in FIG. 2C. The modulation signal generator 234 provides the modulation signal CNTRL1 to the output buffers 233_1, 233_3 . . . at the odd output ends and provides the modulation signal CNTRL2 to the output buffers 233_2, 233_4 . . . at the even output ends. When the frames F31 and F32 are output, the modulation signal CNTRL1 is Logic 1 and the modulation signal CNTRL2 is Logic 0. When the frames F33 and F34 are output, the modulation signal CNTRL1 is Logic 0 and the modulation signal CNTRL2 is Logic 1. The odd columns of the frames F31 and F32 are ΔV, and the even columns are −ΔV. The effect of the offset voltages on the display quality can be eliminated by uniformly distributing the offset voltages in the space. The odd columns of the frames F33 and F34 are −ΔV, and the even columns are ΔV. The effect of the offset voltages on the display quality can also be eliminated by uniformly distributing the offset voltages in the space. Other frames can be deduced likewise according to the same cycle of every four frames.

Figure 4:
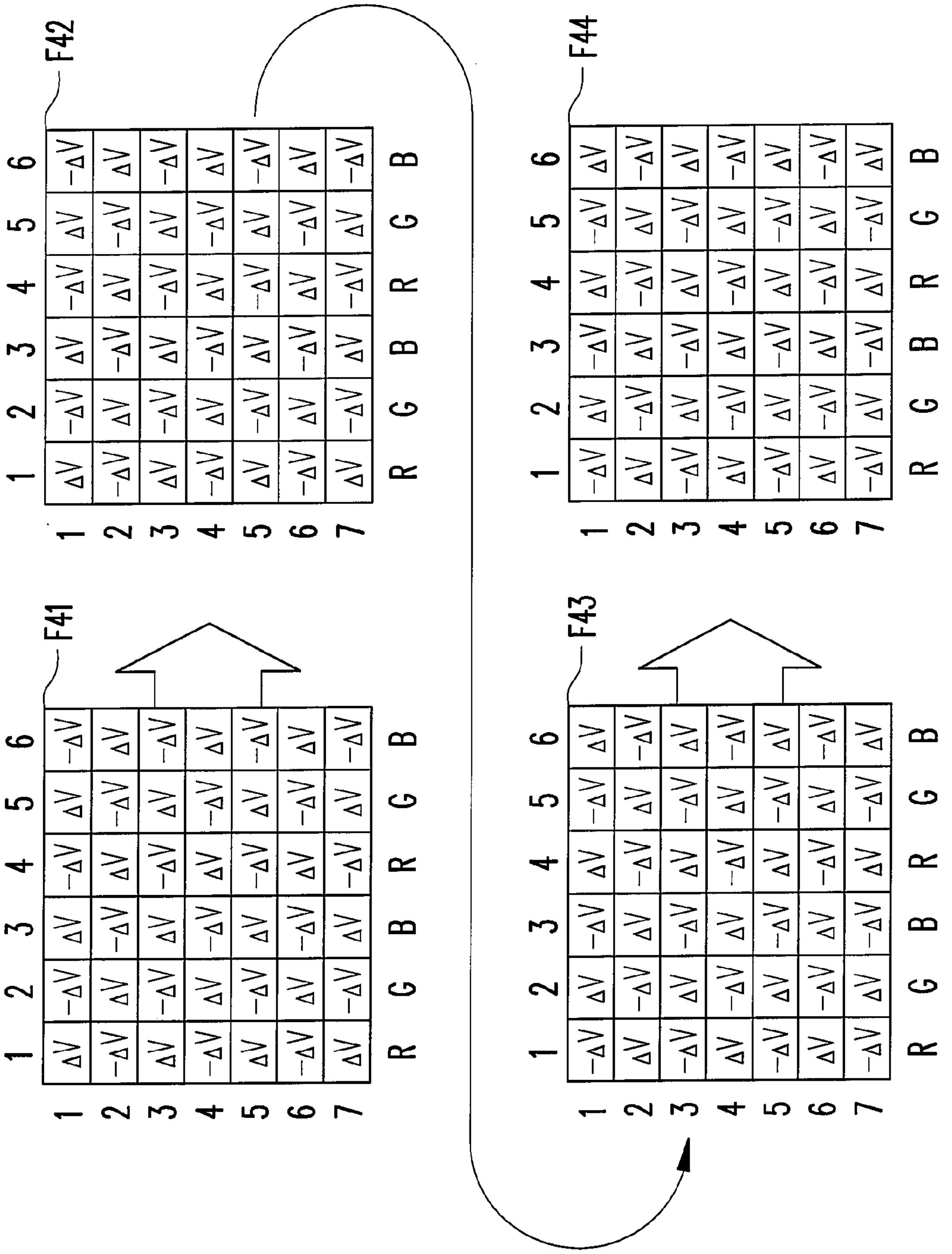
FIG. 4 is an offset voltage distribution diagram of the frames F41~F44 according to another embodiment of the present invention.

FIG. 4 is an offset voltage distribution diagram of frames F41~F44 according to another embodiment of the present invention. In FIG. 4, the positive/negative offset voltages are distributed in a column/row interlaced checkerboard manner. In the present embodiment, the modulation signals CNTRL1 and CNTRL2 generated by the modulation signal generator 234 in FIG. 2C are changed. When the odd scan lines of the frames F41, F42 and the even scan lines of the frames F43, F44 are output, the modulation signal CNTRL1 at the odd output ends is Logic 1 while the modulation signal CNTRL2 at the even output ends is Logic 0. When the even scan lines of the frames F41, F42 and the odd scan lines of the frames F43, F44 are output, the modulation signal CNTRL1 at the odd output ends is Logic 0 while the modulation signal CNTRL2 at the even output ends is Logic 1. Here, the states of the modulation signals CNTRL1 and CNTRL2 are not only changed according to the aforementioned activating signal, but also changed according to the horizontal synchronous signal. When the frame F41 is displayed, the first row is ΔV, −ΔV, ΔV, −ΔV, ΔV, −ΔV, the second row is −ΔV, ΔV, −ΔV, ΔV, −ΔV, ΔV, the third row and the following rows can be deduced likewise. The uniform distribution of the offset voltages ΔV and −ΔV of the frame F41 can compensate the effect of the offset voltages on the display quality. The distributions of the frames F42 and F41 are the same. When the frame F43 is displayed, the first row is −ΔV, ΔV, −ΔV, ΔV, −ΔV, ΔV, the second row is ΔV, −ΔV, ΔV, −ΔV, ΔV, −ΔV, the third row and the following rows can be deduced likewise. The uniform distribution of the offset voltages ΔV and −ΔV of the frame F43 can compensate the effect of the offset voltages on the display quality. The distributions of the frames F44 and F43 are the same. Other frames can be deduced likewise according to the same cycle of every four frames.

Figure 5:
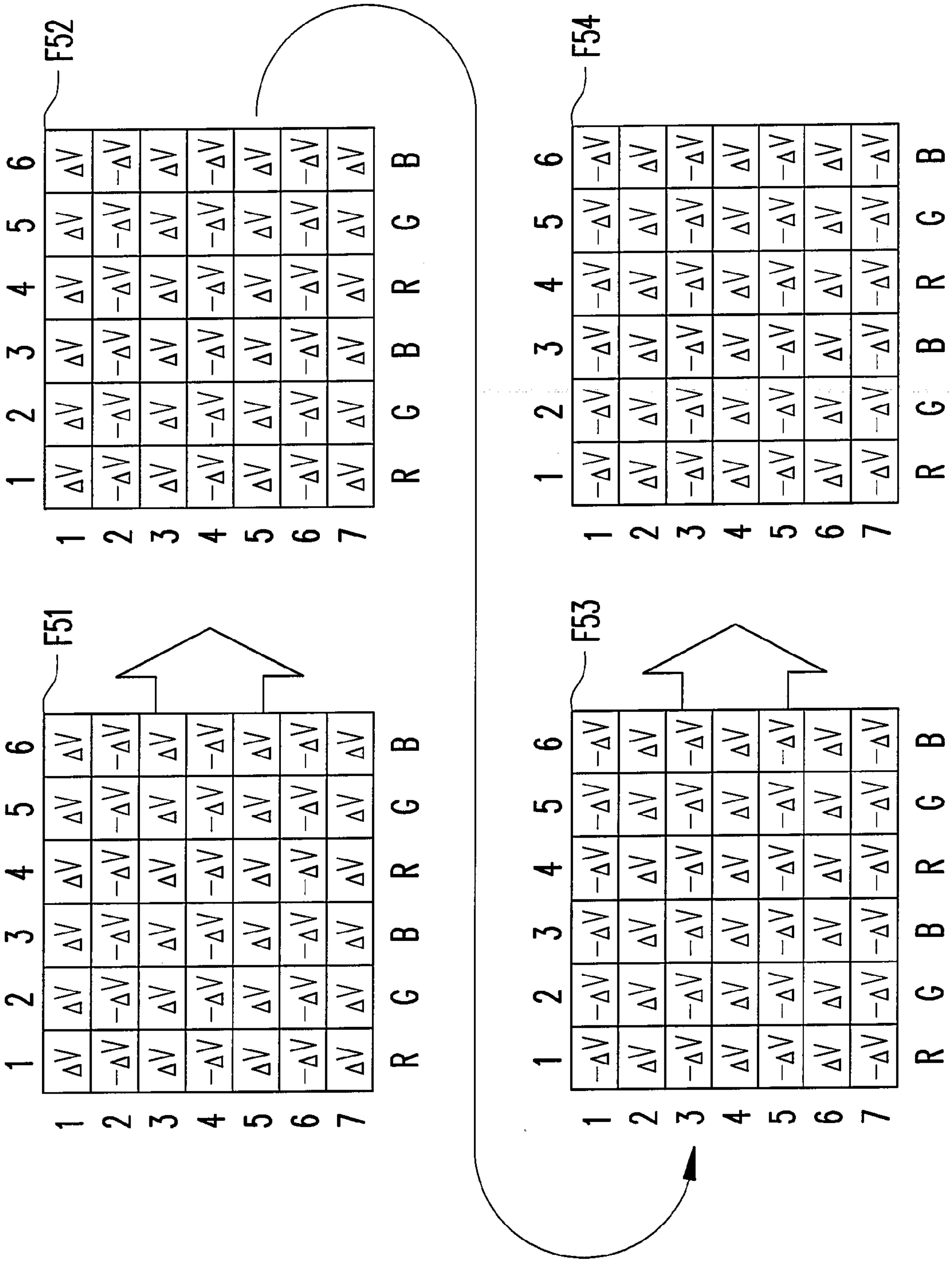
FIG. 5 is an offset voltage distribution diagram of the frames F51~F54 according to another embodiment of the present invention.

FIG. 5 is an offset voltage distribution diagram of frames F51~F54 according to another embodiment of the present invention. In FIG. 5, the positive/negative offset voltages are distributed in a row interlaced manner. In the present embodiment, the modulation signals CNTRL1 and CNTRL2 generated by the modulation signal generator 234 in FIG. 2C are changed. When the odd scan lines of the frames F51, F52 and the even scan lines of the frames F53, F54 are output, the modulation signal CNTRL1 at the odd output ends and the modulation signal CNTRL2 at the even output ends are all Logic 1. When the even scan lines of the frames F51, F52 and the odd scan lines of the frames F53, F54 are output, the modulation signal CNTRL1 at the odd output ends and the modulation signal CNTRL2 at the even output ends are all Logic 0. The present embodiment differs from the above embodiment in that the modulation signals CNTRL1 and CNTRL2 are identical and the states thereof are changed according to the horizontal synchronous signal. When the frame F51 is displayed, the odd rows are all ΔV and the even rows are all −ΔV. The uniform distribution of the offset voltages ΔV and −ΔV of the frame F51 can compensate the effect of the offset voltages on the display quality. The distributions of the frames F52 and F51 are the same. When the frame F53 is displayed, the odd rows are all −ΔV and the even rows are all ΔV. The uniform distribution of the offset voltages ΔV and −ΔV of the frame F53 can compensate the effect of the offset voltages on the display quality. The distributions of the frames F54 and F53 are the same. Other frames can be deduced likewise according to the same cycle of every four frames.

Figure 6:
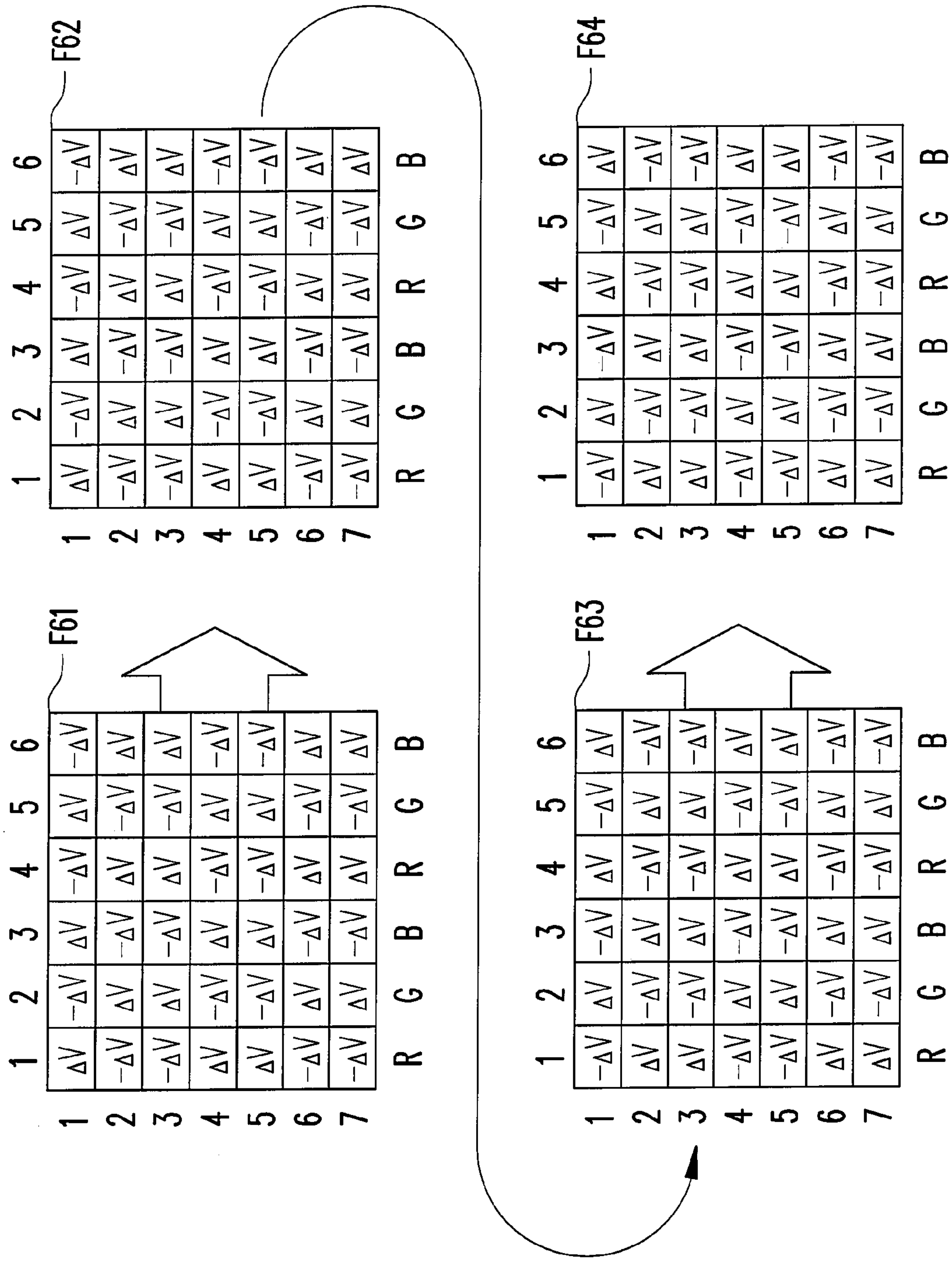
FIG. 6 is an offset voltage distribution diagram of the frames F61~F64 according to another embodiment of the present invention.

FIG. 6 is an offset voltage distribution diagram of frames F61~F64 according to another embodiment of the present invention. Different from the column interlaced manner in FIG. 3D, the checkerboard manner in FIG. 4 and the row interlaced manner in FIG. 5, FIG. 6 is of an asymmetrical interlaced manner. The pixels of the frames F61~F64 in FIG. 6 have two offset voltages, and the numbers of the pixels having the two offset voltages in each of the frames F61~F64 are almost the same. In the present embodiment, the modulation signals CNTRL1 and CNTRL2 generated by the modulation signal generator 234 in FIG. 2C are changed. When a portion of the pixels of a frame is output, the modulation signal received by the output buffer for outputting the portion of the pixels is Logic 1. When the other portion of the pixels of the same frame is output, the modulation signal received by the output buffer for outputting the other portion of the pixels is Logic 0. In particular, when the scan lines 1, 4, 5 of the frames F61, F62 and the scan lines 2, 3, 6, 7 of the frames F63, F64 are output, the modulation signal CNTRL1 at the odd output ends is Logic 1 while the modulation signal CNTRL2 at the even output ends is Logic 0. When the scan lines 2, 3, 6, 7 of the frames F61, F62 and the scan lines 1, 4, 5 of the frames F63, F64 are output, the modulation signal CNTRL1 at the odd output ends is Logic 0 while the modulation signal CNTRL2 at the even output ends is Logic 1. In the present embodiment, the modulation signals CNTRL1 and CNTRL2 are different and the states thereof are changed according to the horizontal synchronous signal. When the frame F61 is displayed, the first, fourth and fifth rows are all ΔV, −ΔV, ΔV, −ΔV, ΔV, −ΔV, and the second, third, sixth and seventh rows are all −ΔV, ΔV, −ΔV, ΔV, −ΔV, ΔV. The uniform distribution of the offset voltages ΔV and −ΔV of the frame F61 can compensate the effect of the offset voltages on the display quality. The distributions of the frames F62 and F61 are the same. When the frame F63 is displayed, the first, fourth and fifth rows are all −ΔV, ΔV, −ΔV, ΔV, −ΔV, ΔV, and the second, third, sixth and seventh rows are all ΔV, −ΔV, ΔV, −ΔV, ΔV, −ΔV. The uniform distribution of the offset voltages ΔV and −ΔV of the frame F63 can compensate the effect of the offset voltages on the display quality. The distributions of the frames F64 and F63 are the same. Other frames can be deduced likewise according to the same cycle of every four frames. In the present embodiment, the distributions of the frames 61 and 62 are the same, and the distributions of the frames 63 and 64 are the same. It should be apparent to those skilled in the art that each frame can have a different distribution manner, instead of being limited to the manner in the embodiment, so as to compensate the effect of the offset voltages on the frame quality by uniformly distributing the positive/negative offset voltages on a frame.

In the above embodiments, if the output buffer receives a modulation signal of Logic 1, it outputs a positive offset voltage, and if the output buffer receives a modulation signal of Logic 0, it outputs a negative offset voltage. In other embodiments of the present invention, the corresponding relation can be opposite, i.e., if the output buffer receives a modulation signal of Logic 0, it outputs a positive offset voltage, and if the output buffer receives a modulation signal of Logic 1, it outputs a negative offset voltage.

The present invention not only provides a driving device in the above embodiments, but also provides a TFT liquid crystal display panel driving method. The technical details of the method have been disclosed in the aforementioned embodiments, and thus will not be described herein.

In view of the above, for different pixels of a frame in the present invention, the effect of the offset voltages on the display quality is eliminated by means of space modulation according to various distribution manners, and no capacitor is needed to store the offset voltages, thus saving circuit elements, preventing the frame flickering phenomenon and improving the display quality.

Though the present invention has been disclosed above by the preferred embodiments, they are not intended to limit the present invention. Anybody skilled in the art can make some modifications and variations without departing from the spirit and scope of the invention. Therefore, the protecting range of the present invention falls in the appended claims.

What is claimed is:

1. A TFT liquid crystal display panel driving device, comprising:

a source driver for driving a TFT liquid crystal display panel, comprising a plurality of output buffers with chopper function; and a modulation signal generator, for providing a first modulation signal only to the output buffers at odd output ends in the source driver and providing a second modulation signal only to the output buffers at even output ends in the source driver;

wherein the first and the second modulation signals are different signals in different states and the states of the first and the second modulation signals control polarities of offset voltages of the output buffers so that odd columns of a first frame and a second frame output by the source driver and even columns of a third frame and a fourth frame output by the source driver have a first polarity of offset voltage;

even columns of the first frame and the second frame and odd columns of the third frame and the fourth frame have a second polarity of offset voltage, wherein the first and the second polarities have opposite signs.

2. The TFT liquid crystal display panel driving device according to claim 1, wherein the states of the first modulation signal and the second modulation signal are changed according to a polarity signal.

3. The TFT liquid crystal display panel driving device according to claim 1, wherein the states of the first modulation signal and the second modulation signal are changed according to a vertical synchronization signal.

4. The TFT liquid crystal display panel driving device according to claim 1, wherein the states of the first modulation signal and the second modulation signal are changed according to a first output signal of a first gate driver of the TFT liquid crystal display panel.

5. A TFT liquid crystal display panel driving method, comprising:

providing a first modulation signal only to at least one output buffer at odd output ends in a source driver of a TFT liquid crystal display panel; and providing a second modulation signal only to at least one output buffer at even output ends in the source driver; wherein the output buffers have chopper function;

the first and the second modulation signals are different signals in different states and the states of the first and the second modulation signals control polarities of offset voltages of the output buffers so that odd columns of a first frame and a second frame output by the source driver and even columns of a third frame and a fourth frame output by the source driver have a first polarity of offset voltage;

even columns of the first frame and the second frame and odd columns of the third frame and the fourth frame have a second polarity of offset voltage, wherein the first and the second polarities have opposite signs.

6. The TFT liquid crystal display panel driving method according to claim 5, wherein the states of the first modulation signal and the second modulation signal are changed according to a polarity signal.

7. The TFT liquid crystal display panel driving method according to claim 5, wherein the states of the first modulation signal and the second modulation signal are changed according to a vertical synchronous signal.

8. The TFT liquid crystal display panel driving method according to claim 5, wherein the states of the first modulation signal and the second modulation signal are changed according to a first output signal of a first gate driver of the TFT liquid crystal display panel.

9. A TFT liquid crystal display panel driving device, comprising:

a source driver for driving a TFT liquid crystal display panel, comprising a plurality of output buffers with chopper function; and a modulation signal generator, for providing a first modulation signal only to the output buffers at odd output ends in the source driver and providing a second modulation signal only to the output buffers at even output ends in the source driver;

wherein the first and the second modulation signals are different signals in different states and the states of the first and the second modulation signals control polarities of offset voltages of the output buffers so that odd dots of odd scan lines and even dots of even scan lines of a first frame and a second frame output by the source driver and even dots of odd scan lines and odd dots of even scan lines of a third frame and a fourth frame output by the source driver have a first polarity of offset voltage;

even dots of odd scan lines and odd dots of even scan lines of the first frame and the second frame and odd dots of odd scan lines and even dots of even scan lines of the third frame and the fourth frame have a second polarity of offset voltage, wherein the first and the second polarities have opposite signs.

10. A TFT liquid crystal display panel driving method, comprising:

providing a first modulation signal only to at least one output buffer at odd output ends in a source driver of a TFT liquid crystal display panel; and providing a second modulation signal only to at least one output buffer at even output ends in the source driver; wherein the output buffers have chopper function;

the first and the second modulation signals are different signals in different states and the states of the first and the second modulation signals control polarities of offset voltages of the output buffers so that odd dots of odd scan lines and even dots of even scan lines of a first frame and a second frame output by the source driver and even dots of odd scan lines and odd dots of even scan lines of a third frame and a fourth frame output by the source driver have a first polarity of offset voltage;

even dots of odd scan lines and odd dots of even scan lines of the first frame and the second frame and odd dots of odd scan lines and even dots of even scan lines of the third frame and the fourth frame have a second polarity of offset voltage, wherein the first and the second polarities have opposite signs.

11. A liquid crystal display panel driving device, comprising:

a source driver for driving a liquid crystal display panel, comprising a plurality of output buffers with chopper function; and a modulation signal generator, for providing a first modulation signal only to the output buffers at odd output ends in the source driver and providing a second modulation signal only to the output buffers at even output ends in the source driver;

wherein two successive scan lines of the liquid crystal display panel is defined as a first scan-line unit, and two successive scan lines following the first scan-line unit is defined as a second scan-line unit;

the first and the second modulation signals are different signals in different states and the states of the first and the second modulation signals control polarities of offset voltages of the output buffers so that odd columns of the first scan-line unit and even columns of the second scan-line unit of a first frame and a second frame output by the source driver and even columns of the first scan-line unit and odd columns of the second scan-line unit of a third frame and a fourth frame output by the source driver have a first polarity of offset voltage;

even columns of the first scan-line unit and odd columns of the second scan-line unit of the first frame and the second frame and odd columns of the first scan-line unit and even columns of the second scan-line unit of the third frame and the fourth frame have a second polarity of offset voltage, wherein the first and the second polarities have opposite signs.

12. The liquid crystal display panel driving device according to claim 11, wherein the states of the first and the second modulation signals are changed according to a horizontal synchronous signal.

13. A liquid crystal display panel driving method, comprising:

providing a first modulation signal only to at least one output buffer at odd output ends in a source driver of a liquid crystal display panel; and providing a second modulation signal only to at least one output buffer at even output ends in the source driver; wherein the output buffers have chopper function;

two successive scan lines of the liquid crystal display panel is defined as a first scan-line unit, and two successive scan lines following the first scan-line unit is defined as a second scan-line unit;

the first and the second modulation signals are different signals in different states and the states of the first and the second modulation signals control polarities of offset voltages of the output buffers so that odd columns of the first scan-line unit and even columns of the second scan-line unit of a first frame and a second frame output by the source driver and even columns of the first scan-line unit and odd columns of the second scan-line unit of a third frame and a fourth frame output by the source driver have a first polarity of offset voltage;

even columns of the first scan-line unit and odd columns of the second scan-line unit of the first frame and the second frame and odd columns of the first scan-line unit and even columns of the second scan-line unit of the third frame and the fourth frame have a second polarity of offset voltage, wherein the first and the second polarities have opposite signs.

* * * * *